(12) United States Patent
Lin et al.

(10) Patent No.: US 7,971,722 B2
(45) Date of Patent: Jul. 5, 2011

(54) WAFER CONTAINER WITH RESTRAINER

(75) Inventors: Chin-Ming Lin, Shulin (TW);
Kuan-Lun Pan, Shulin (TW)

(73) Assignee: Gudeng Precision Industrial Co, Ltd, Shulin (TW)

( * ) Notice: Subject to any disclaimer, the term of this patent is extended or adjusted under 35 U.S.C. 154(b) by 228 days.

(21) Appl. No.: 12/188,252

(22) Filed: Aug. 8, 2008

(65) Prior Publication Data

US 2009/0032433 A1 Feb. 5, 2009

(51) Int. Cl.
*B65D 85/00* (2006.01)
(52) U.S. Cl. ........................................... 206/711
(58) Field of Classification Search .................. 206/701, 206/710, 711, 722, 723, 454
See application file for complete search history.

(56) References Cited

U.S. PATENT DOCUMENTS

| | | | |
|---|---|---|---|
| 4,718,549 A * | 1/1988 | Rissotti et al. | 206/711 |
| 4,721,207 A * | 1/1988 | Kikuchi | 206/307 |
| 5,025,924 A * | 6/1991 | Watanabe | 206/454 |
| 5,228,568 A | 7/1993 | Ogino et al. | |
| 5,273,159 A | 12/1993 | Gregerson | |
| 5,452,795 A | 9/1995 | Gallagher et al. | |
| 5,555,981 A | 9/1996 | Gregerson | |
| 6,082,540 A | 7/2000 | Krampotich et al. | |
| 6,168,025 B1 * | 1/2001 | Sakurai et al. | 206/711 |
| 6,267,245 B1 | 7/2001 | Bores et al. | |
| 6,315,124 B1 * | 11/2001 | Hirohata et al. | 206/454 |
| 6,364,922 B1 * | 4/2002 | Tanaka et al. | 55/385.1 |
| 6,581,264 B2 | 6/2003 | Ohori et al. | |
| 6,591,987 B2 | 7/2003 | Wu et al. | |
| 6,644,477 B2 | 11/2003 | Bores et al. | |
| 6,736,268 B2 | 5/2004 | Nyseth et al. | |
| 6,951,284 B2 * | 10/2005 | Cheesman et al. | 206/711 |
| 7,017,749 B2 | 3/2006 | Yajima et al. | |
| 7,100,772 B2 | 9/2006 | Burns et al. | |
| 7,216,766 B2 | 5/2007 | Matsutori et al. | |
| 7,316,315 B2 | 1/2008 | Matsutori et al. | |
| 7,344,031 B2 | 3/2008 | Hasegawa et al. | |
| 7,370,764 B2 | 5/2008 | Nyseth et al. | |
| RE40,513 E * | 9/2008 | Krampotich et al. | 206/445 |
| 2003/0221985 A1 * | 12/2003 | Yajima et al. | 206/454 |
| 2005/0218034 A1 * | 10/2005 | Kawashima | 206/710 |
| 2005/0247594 A1 * | 11/2005 | Mimura et al. | 206/710 |
| 2006/0042998 A1 * | 3/2006 | Haggard et al. | 206/711 |
| 2006/0108258 A1 * | 5/2006 | Burns et al. | 206/711 |
| 2006/0213796 A1 * | 9/2006 | Kominami | 206/454 |

* cited by examiner

*Primary Examiner* — Jacob K Ackun, Jr.
(74) *Attorney, Agent, or Firm* — Ming Chow; Sinorica, LLC

(57) ABSTRACT

A wafer container includes a container body that having a plurality of slots therein for placing a plurality of wafers; an opening is formed on a sidewall of the container body for importing or exporting the wafers; and a door having an inner surface and an outer surface, in which the inner surface of the door is joined with the opening of the container body for protecting the plurality of wafers therein, the characteristic in that: a recess is disposed in the central portion of the inner surface of the door to divide the inner surface into two platforms, and each restraint module is located on two platforms.

20 Claims, 6 Drawing Sheets

WAFER CONTAINER WITH RESTRAINER

BACKGROUND OF THE INVENTION

1. Field of the Invention

The present invention is related to a front opening unified pod (FOUP), more particularly to a restraint module being disposed on two platforms adjacent to the recess of inner surface of the door. Thus, the wafer can be disposed within the recess of the door to reduce the size of FOUP, and the wafer restraint component can sustain the wafer to avoid from movement during the wafer transportation.

2. Description of the Prior Art

The semiconductor wafers are transferred to different stations to apply the various processes in the required equipments. A sealed container is provided for automatic transfer to prevent the pollution. FIG. 1 shows the views of wafer container of the conventional prior art. The wafer container is a front opening unified pod (FOUP) which includes a container body 10 and a door 20. The container body 10 is disposed a plurality of slots for placing the plurality of wafers, and an opening 12 is located on the sidewall of the container body 10 for loading or unloading. Further, the door 20 includes an outer surface 21 and an inner surface 22, in which the door 20 is joined the opening 12 of the container body 10 to protect the plurality of wafers within the container body 10. Furthermore, at least one latch component 23 is disposed on the outer surface 21 of the door 20 for opening or closing the wafer container. According to aforementioned, due to the wafer is placed in the container body 10 in horizontal, thus, the FOUP needs a wafer restraint component to avoid from movement during the wafer transportation.

FIG. 2 is a view of a front opening unified pod (FOUP) as described in U.S. Pat. No. 6,736,268. As shown in FIG. 2, the inner surface 22 of the door 20 is disposed with a recess 24 and the recess 24 is extended from the top 221 of the inner surface 22 to the bottom 222, and is located between two locking components 230 (inside of the door 200). The wafer restraint module (not shown in Figure) further includes the recess 24, in which the wafer restraint module consists two wafer restraint components 100, and each wafer restraint component 100 includes a plurality of wafer contact heads 110 to sustain the wafers, so as to prevent the wafer from the moving toward the door opening due to the wafer transportation procedure. However, the wafer restraint module is disposed on the recess 24 of the inner surface 22 of the door 20, and the wafer merely is attached to the inner surface 22 of the door 20 or the wafer is partially settled down within the recess 24. The wafers either sit adjacent to the inner surface 22 of the door 20 or only slightly enter into the recess 24. As resulted, the wafers do not securely and fully settle into the recess 24 in order to effectively shorten the length between the front side and the back side of the FOUP. In addition, the tiny dust particles are generated due to the friction between the wafer restraint module and the wafers can easily accumulate in the recess 24. In the process of cleaning the accumulated dust particles, it is necessary to separate the wafer restraint module from the recess 24 on the inner surface 22 of the door 20. By frequently separation and assembly of the wafer restraint module due to the cleaning process, the wafer restraint module is easily slackened.

SUMMARY OF THE INVENTION

According to the drawbacks of the aforementioned, the present invention provides a front opening unified pod (FOUP) with wafer restraint modules disposed on two platforms and adjacent to the two platforms, and the platforms is disposed on two sides of the recess of the inner surface of the door. The wafers can thus fully, and effectively be filled in the space of the recess. This makes shortening the length between the front side and the back side of the FOUP is possible.

The other objective of the present invention is to provide a front opening unified pod (FOUP) with wafer restraint module, and the wafer restraint modules are disposed on the platforms of the two sides of the recess of the inner surface of door. With such, the tiny dust particles generated due to the friction between the wafer restraint module and wafer can drop and be collected at the corners the recess. When cleaning the FOUP, it becomes easy in cleaning the dust particles without removing the wafer restraint module.

According to above objectives, the present invention provides a wafer container, which includes a container body, and the inner surface of the container body includes a plurality of slots for placing a plurality of wafers therein; a side-wall of the container body includes an opening for exporting or importing of wafers; the inner surface of the door is joined with the opening of the container body for protecting the plurality of wafers therein, the characteristic in that: a recess is disposed in the inner surface of door to divide the inner surface into two platforms, and each restraint component is disposed on each platforms.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
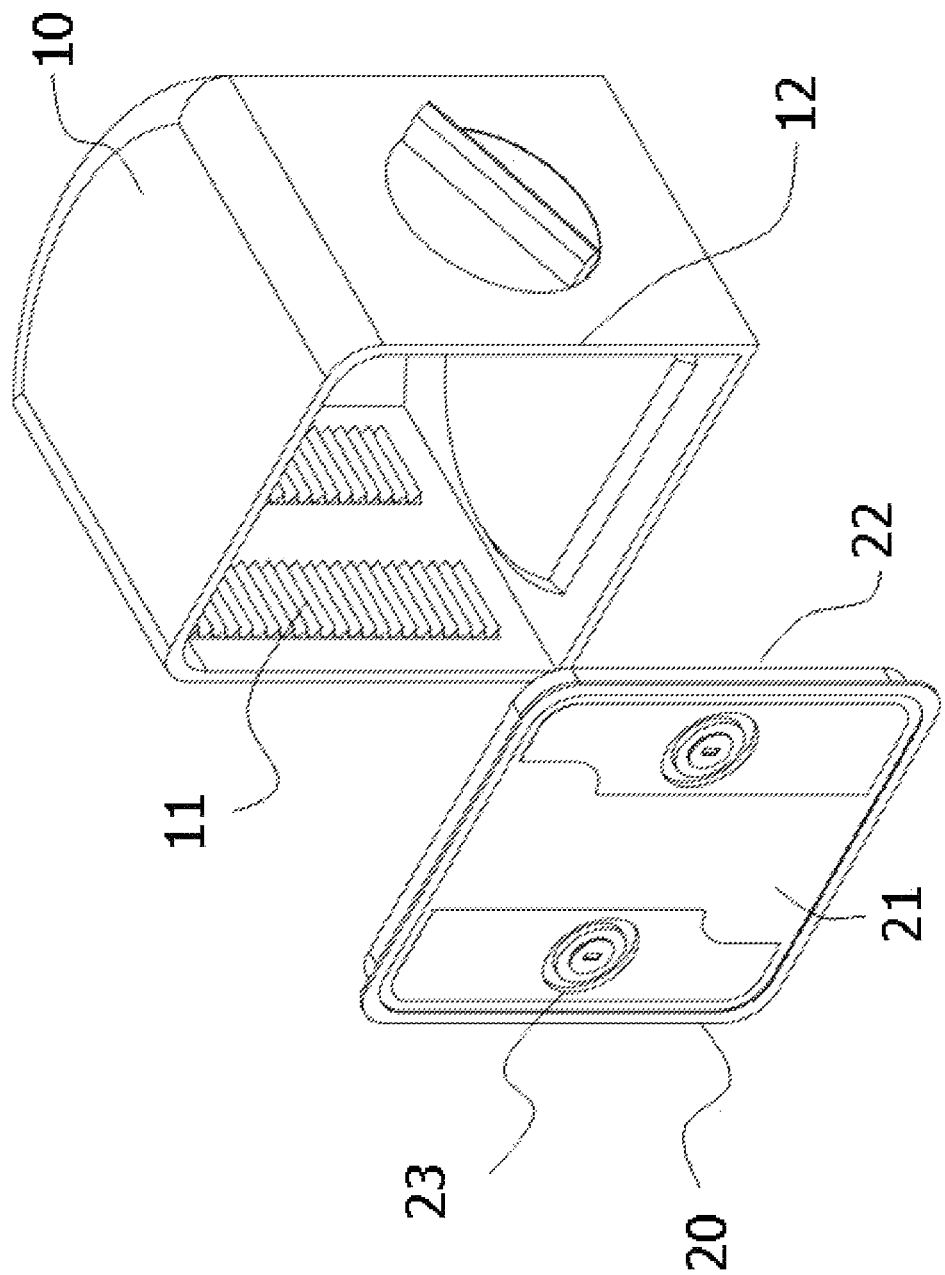
FIG. 1 is a sectional view of the wafer container of the prior art.
Figure 2:
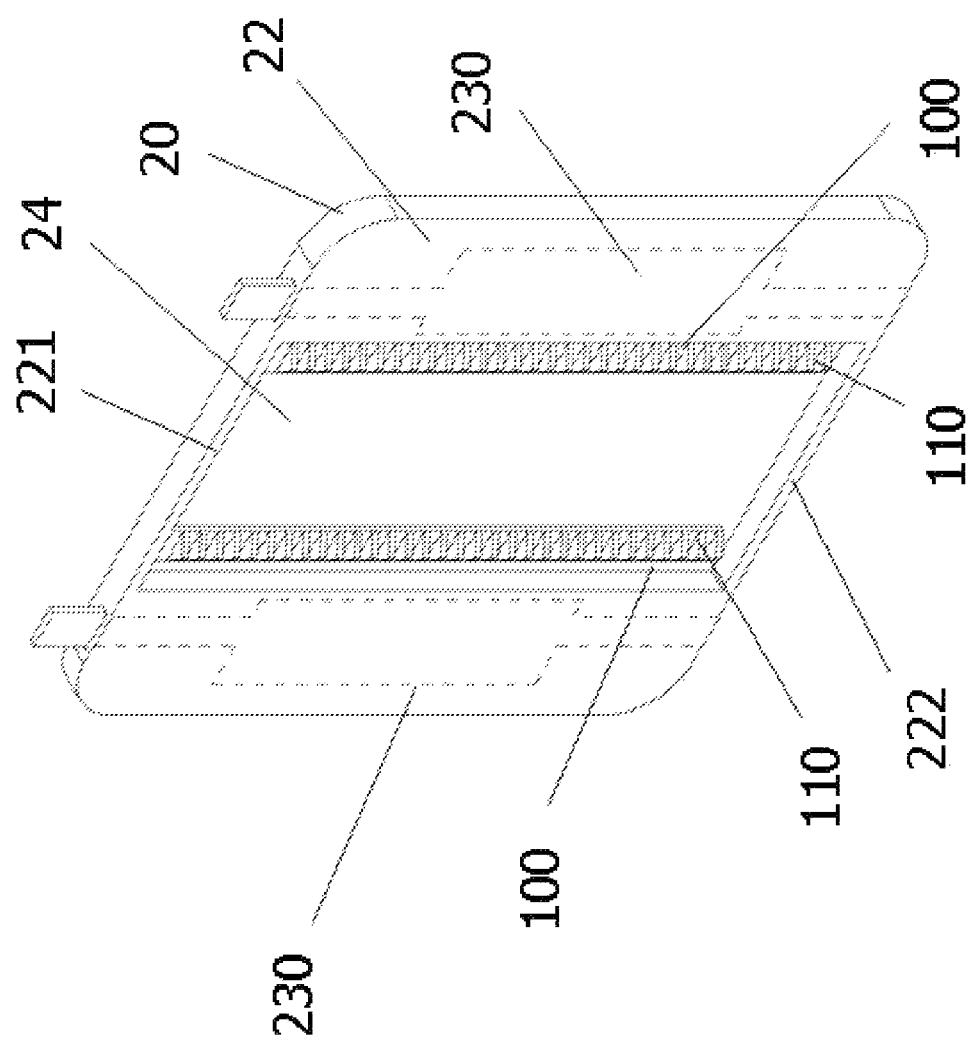
FIG. 2 is a sectional view of the wafer restraint component of the prior art.
Figure 3:
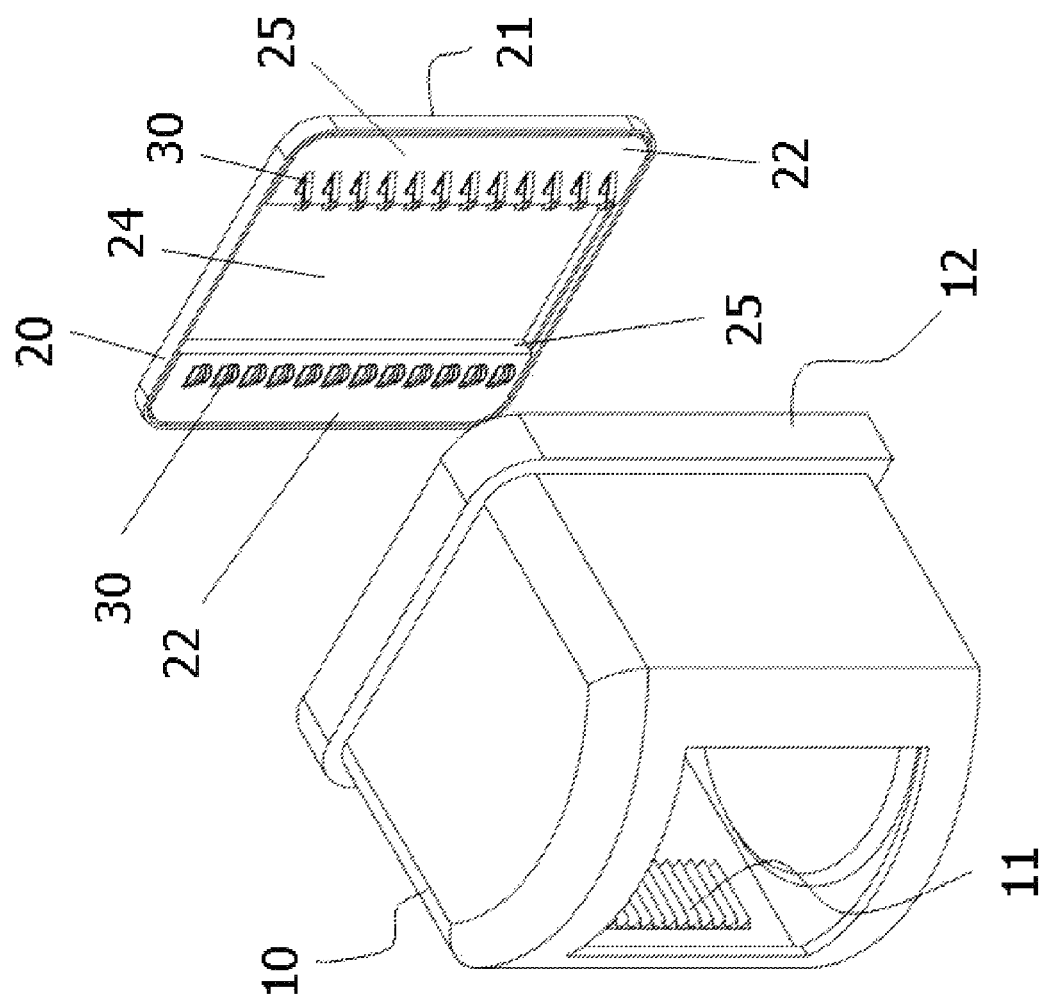
FIG. 3 is a view of the wafer container of the present invention.

Referring to FIG. 3 shows a view of the wafer container of the first embodiment. The wafer container is a front opening unified pod (FOUP) which includes a container body 10 and a door 20. A plurality of slots 11 is disposed in the inside of the container body 10 to place a plurality of wafers therein, and an opening 12 is located on one of sidewalls of the container body 10 that is provided for exporting or importing of wafer. The doors 20 include an outer surface 21 and an inner surface 22. The central portion of the inner surface 22 of the door 20 includes a recess 24, and the recess 24 can divide the inner surface 22 into two platforms 25. Due to the inside of recess 24 without any components, thus, the recess 24 can place the plurality of wafers therein, and the portions of wafer can extend into the recess 24. Thus, this devise of the recess 24 can reduce the size of the wafer container. Furthermore, each wafer restraint module 30 is disposed on the two platforms 25 of the door 20, and each wafer is pushed toward the position in the container body 10 when the door 20 of the wafer container is closed. The advantage is that the wafer can be restricted from moving toward the opening of the wafer container, and the number of the wafers is settled down the recess 24 that can be controlled. Furthermore, each platform 25 is provided to have a latch component (not shown in Figure) thereon, and a latch opening is formed on the outer surface 21 corresponding to each latch component.

The length of the recess 24 of the inner surface 22 of the door 20 is related to the distance of the slots 11 of the container body 10 and the number of the wafers. For example, the distances between the 12" or 18" wafers have been a standard regulation in the industry to obtain the maximum ability of loading and the space is enough to contain the arm to export or import. In general, the number of wafers for the wafer container is 25 pieces. Thus, the length of the recess 24 is constant. However, the width and the depth of the recess 24 of this embodiment can be adjusted. When the width of the door 20 is constant, the depth of the recess 24 can be adjusted to deeper, and the width of recess 24 is also adjusted to wider, so as the whole wafer can place within the recess 24.

Figure 4:
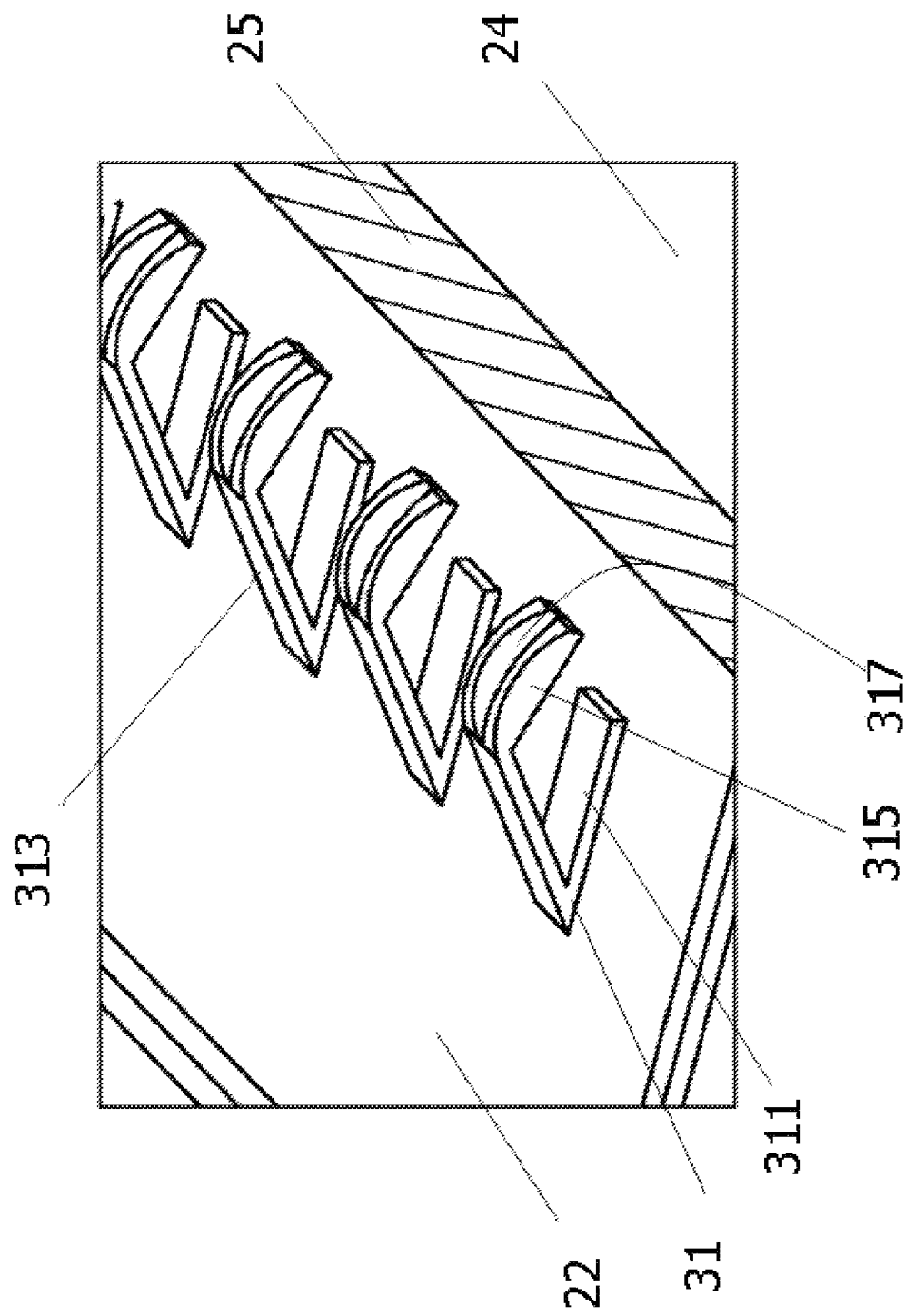
FIG. 4 is a view of the wafer restraint module of the wafer container of the present invention.
Figure 5:
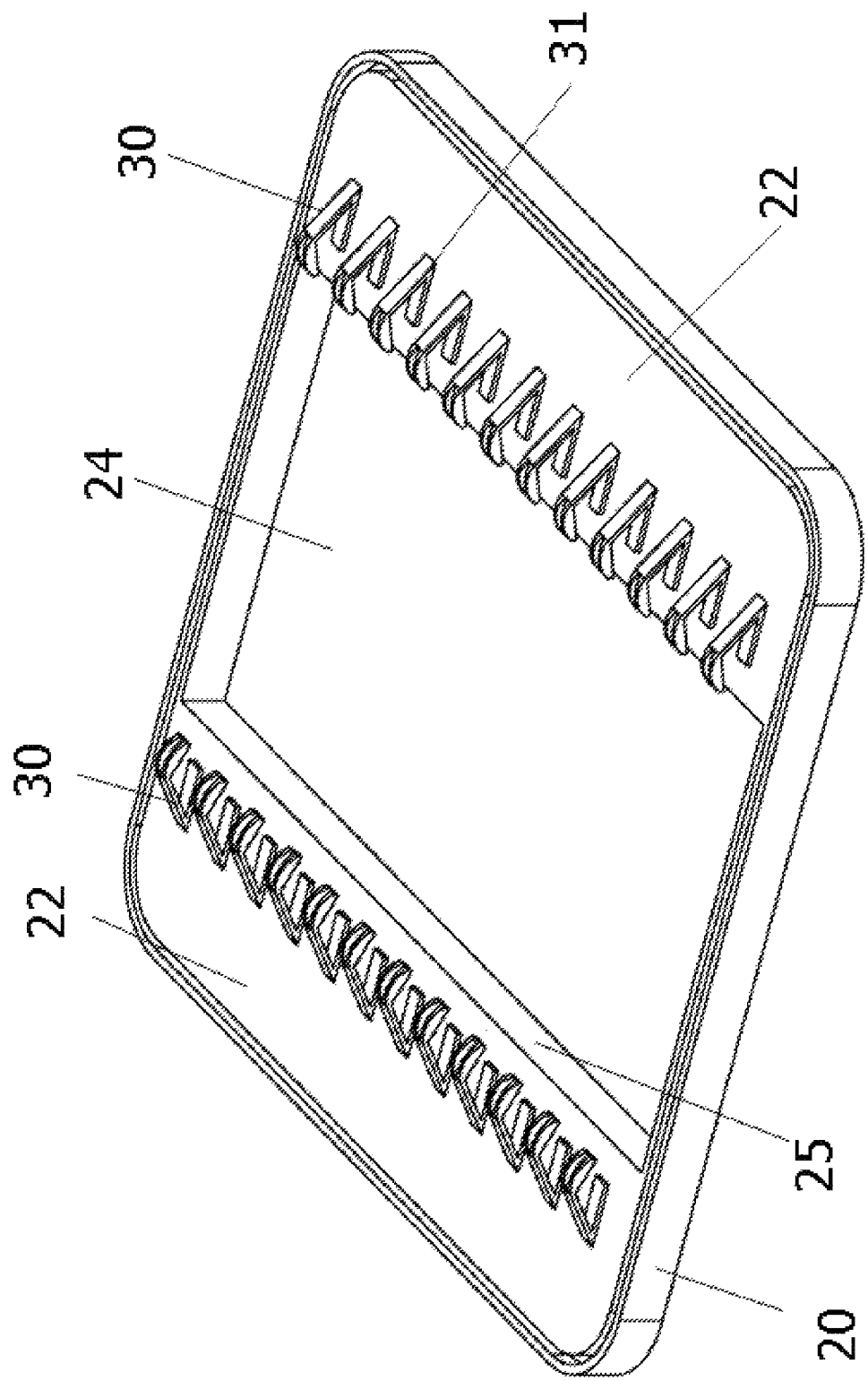
FIG. 5 is a view of the wafer restraint module fixed on the door of the present invention.

Moreover, referring to FIG. 4 and FIG. 5, show the views of the wafer restraint module of the wafer container and fixed on the door. First, as shown in FIG. 4, the wafer restraint module 30 consists of a plurality of restraint components 31 and wedges on the platform 25.

Each restraint component 31 aligned with another restraint component 31 of the wafer restraint modules 30 that is located on another platform, so that the restraint component 31 can contact the wafer to restrict the wafer from moving toward the opening of the door during the wafer transportation. In addition, the restraint component 31 composed of a base portion 311 and a support arm 313.

The support arm 313 is joined with one end of the base portion 311, and is connected to one end of the base portion 311 and is bended toward the recess 24. Furthermore, a curved toward supporting portion 515 is formed on the free-end of the support arm 313 and is contacted with the wafer with contacting points between the supporting portions 515 and the wafers located on two platforms 25. In a preferred embodiment of the present invention, an acute angle is located between the base portion 311 and the support arm 313, the angle is related to the position for the wafer restraint module 30 is disposed on the platform 25. For example, the acute angle is about 10 to 60 degree. Moreover, in another embodiment of the present invention, the supporting portion 313 can become a V-shaped like guide notch 317 to guide the wafer into the guide notch 317 to avoid the wafer from the movement when the restraint component 31 is contacted the supporting portion 315. In addition, in order to guide the wafer into the guide notch 317, and the inner surface of V-shaped of the guide notch 317 became a smooth surface or curve surface. The wear-resisting material is coated on the contacted area between the wafer and the support portion. The wear-resisting material is PEEK material and used to reduce the friction for the wafer.

In addition, another embodiment of the present invention, the wafer restraint module 30 is an integrated. For example, the base portion 311 of the wafer restraint module 30 is joined together to form a common base portion (not shown in Figure), and the support arm 313 of the wafer restraint module 30 is arranged at a spaced with interval. Then, the common base portion wedges the platforms 25.

Each wafer restraint module 30 is aligned with the wafer restraint module 30 on another platform 25, thus, each restraint components 31 on two sides of platforms 25 can contact the wafer to restrict the wafer from moving toward the opening of the container body 10 during the wafer transportation. Obviously, a curved angle is located between the each support arm 313 of wafer restraint module 30 and the common base portion is about 10 to 60 degree. The wafer restraint module 30 is made of polymer plastic material, or made of two different materials. For example, the support arm 313 and base portion 311 are made of polymer plastic material, and the supporting portion 315 is made of PEEK material. Herein, the material of polymer plastic can be PC, ABS, PP, PE, or PFA.

Figure 6:
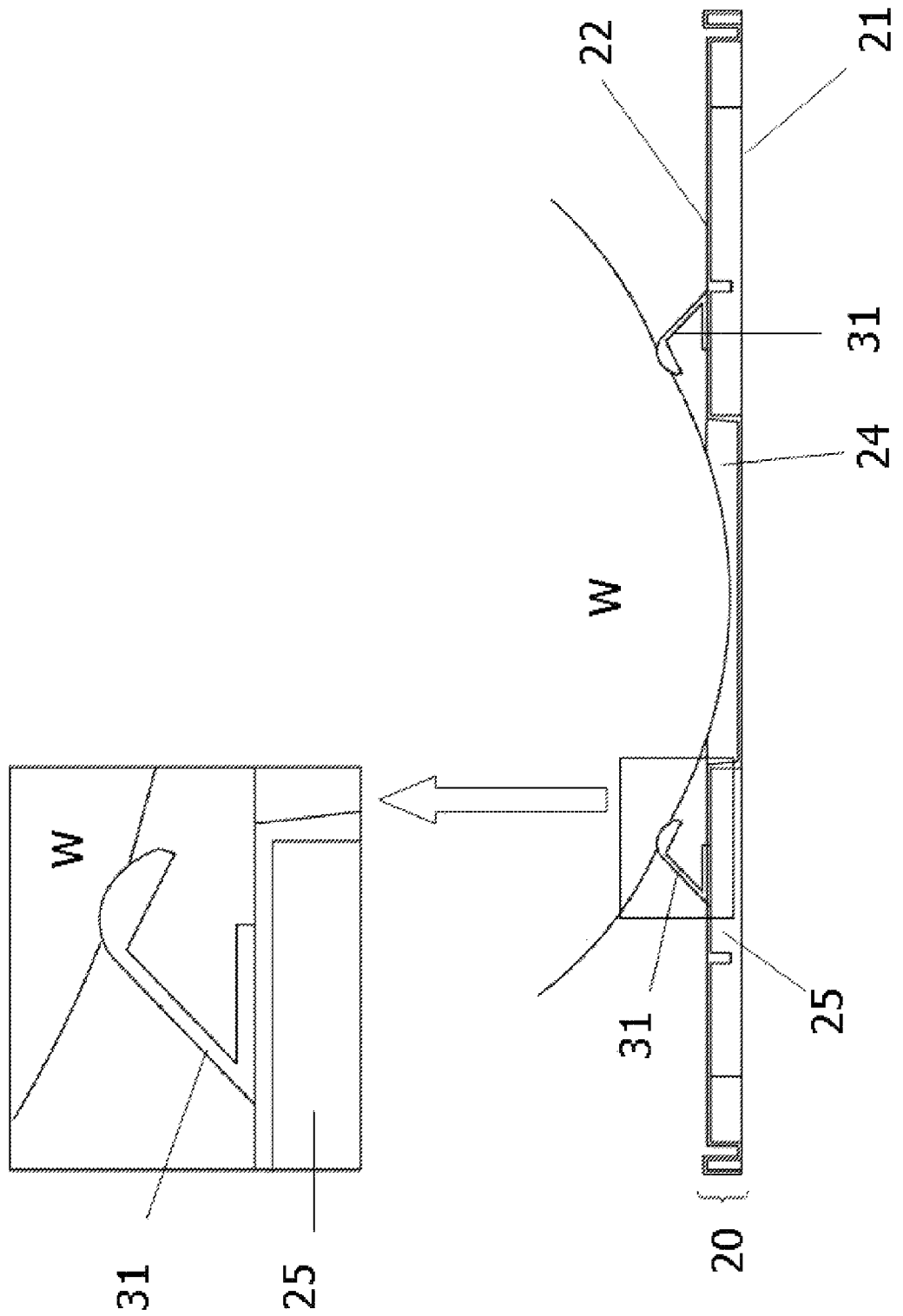
FIG. 6 is a view of the wafer restraint module of wafer container contacted the wafer of the present invention.

Next, FIG. 6 shows a view of wafer restraint module of wafer container contacted the wafer. Each wafer restraint module 30 is located on the each platform 25 and adjacent to the recess 24 is symmetrical, thus, the resultant force is generated and is pushed toward the central of wafer to restrict the wafer from movement when the wafer restraint module 30 is contacted the wafer. Due to the inside of recess 24 without any components, thus, the recess 24 can provide for placing the plurality of wafers therein, and the portions of wafer can extend into the recess 24. Thus, this devise of the recess 24 can reduce the size of the wafer container. Therefore, the center of the wafer container is adjacent to the center of the whole wafer container, thus, the slit of the wafer container would not generate easily during the wafer container transportation by machine arm. Furthermore, the included angle is located between the base portion 311 and support arm 313 that can control the distance for the wafer entered the recess 24, so that the size of the wafer container can be adjusted. Due to the wafer restraint module 30 is disposed on two sides of platforms 25 of the recess 24 of the inner surface 22 of the door 20, the distance is shorten for restoring the wafer to the original position when the wafer is supported by the wafer restraint module 30. Therefore, the door 20 of the wafer container can easily close and the tiny dust particles can be reduced.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container comprising a container body that having a plurality of slots for placing a plurality of wafers; an opening, is formed on a sidewall of said wafer container for exporting said plurality of wafers or importing said plurality of wafers; and a door having an inner surface and an outer surface, wherein said inner surface of said door is joined with said opening of said container body for protecting said plurality of wafers therein, the characteristic in that:

a recess is disposed on said inner surface of said door for partitioning said inner surface to form two platforms and a restraint module is disposed on each of said two platforms respectively, each of said two restraint modules consisting of a plurality of restraint components and each of said plurality of restraint components of one of said two restraint modules on said two platforms being aligned with each of said plurality of restraint components of the other of said two restraint modules, wherein each of said plurality of restraint components includes a base portion and a supporting arm connected to one end of said base portion and bending toward said recess, a downward curving support portion being further formed on a free-end of said supporting arm, said downward curving support portions being in contact with said plurality of wafers with contacting points between said support portions and said wafers located on said two platforms.

2. The wafer container according to claim 1, wherein a guide notch with a V-shaped like is formed on a top of each of said support portion.

3. The wafer container according to claim 1, wherein each of said two restraint modules is an integrated structure.

4. The wafer container according to claim 1, wherein a wear-resisting material is coated on the contacted area between said support portion and each of said plurality of wafers.

5. The wafer container according to claim 4, wherein the material of said wear-resisting material is PEEK material.

6. The wafer container according to claim 1, wherein the material of said support portion is a wear-resisting material.

7. The wafer container according to claim 6, wherein the material of said wear-resisting material is PEEK material.

8. The wafer container according to claim 1, wherein an acute angle is located between said base portion and said support portion.

9. The wafer container according to claim 8, wherein said acute angle is about 10 to 60 degree.

10. The wafer container according to claim 1, wherein a latch component is located on each of said two platforms.

11. A wafer container comprising a container body that having a plurality of slots for placing a plurality of wafers; an opening, is formed on a sidewall of said wafer container for exporting said plurality of wafers or importing said plurality of wafers; and a door having an inner surface and an outer surface, wherein said inner surface of said door is joined with said opening of said container body for protecting said plurality of wafers therein, the characteristic in that:
a recess is disposed on said inner surface of said door to separate said inner surface into two platforms and a restraint module is disposed on each of said two platforms respectively.

12. The wafer container according to claim 11, wherein a latch component is located on each of said two platforms.

13. A wafer container comprising a container body that having a plurality of slots for placing a plurality of wafers; an opening, is formed on a sidewall of said wafer container for exporting said plurality of wafers or importing said plurality of wafers; and a door having an inner surface and an outer surface, wherein said inner surface of said door is joined with said opening of said container body for protecting said plurality of wafers therein, the characteristic in that:
a recess is disposed on the central of said inner surface to separate said inner surface into two platforms and a restraint module is disposed on each of said two platforms respectively, one of said restraint module is joined with another via a common base portion, and a plurality of support arms with a spaced at interval, wherein each of said plurality of support arms connected to one end of said base portion and bending toward said recess, and a downward curving support portion being further formed on a free-end of said support arm, said downward curving support portions being in contact with said plurality of wafers with contacting points between said support portions and said wafers located on said two platforms.

14. The wafer container according to claim 13, wherein a guide notch with a V-shaped like is formed on a top of each of said support portion.

15. The wafer container according to claim 13, wherein a wear-resisting material is coated on the contacted area between said support portion and each of said plurality of wafers.

16. The wafer container according to claim 15, wherein the material of said wear-resisting material is PEEK material.

17. The wafer container according to claim 13, wherein the material of said support portion is a wear-resisting material.

18. The wafer container according to claim 17, wherein the material of said wear-resisting material is PEEK material.

19. The wafer container according to claim 13, wherein said acute angle is located between said common base portion and said support arm, and is about 10 to 60 degree.

20. The wafer container according to claim 13, wherein a latch component is located on each of said two platforms.

* * * * *